United States Patent [19]

Zibert

[11] 4,119,871
[45] Oct. 10, 1978

[54] FUNCTION GENERATOR FOR THE PRODUCTION OF A VOLTAGE ACROSS A NODE TO WHICH ARE CONNECTED FLIP-FLOPS WHICH ARE ARRANGED IN BIT LINES OF A MOS MEMORY AND CONSISTS OF MOS TRANSISTORS

[75] Inventor: Klaus Zibert, Hohenschäftlarn, Germany

[73] Assignee: Siemens Aktiengesellschaft, Berlin & Munich, Germany

[21] Appl. No.: 802,815

[22] Filed: Jun. 2, 1977

[30] Foreign Application Priority Data

Jul. 8, 1976 [DE] Fed. Rep. of Germany ....... 2630797

[51] Int. Cl.² .......................... H03K 5/20; G11C 7/06; H03K 3/353; H03K 3/286
[52] U.S. Cl. ..................................... 307/355; 307/238; 307/246; 307/262; 307/279; 307/DIG. 3; 365/204; 365/205
[58] Field of Search ............... 307/238, 246, 355, 356, 307/362, 363, 279, 289, 291, DIG. 3, 208, 262, 251; 365/203, 204, 205

[56] References Cited

U.S. PATENT DOCUMENTS

| 3,774,176 | 11/1973 | Stein et al. ...................... 307/246 X |
| 3,892,984 | 7/1975 | Stein .......................... 307/DIG. 3 X |
| 3,949,381 | 4/1976 | Dennard et al. ................. 307/238 X |
| 3,993,917 | 11/1976 | Kalter .............................. 307/238 X |
| 4,000,413 | 12/1976 | Wong et al. ............... 307/DIG. 3 X |
| 4,025,907 | 5/1977 | Karp et al. .................... 340/173 CA |
| 4,027,294 | 5/1977 | Meusberger et al. ............. 307/200 B |
| 4,028,557 | 6/1977 | Wilson .............................. 307/238 X |
| 4,050,061 | 9/1977 | Kitagawa ........................ 340/173 R |

OTHER PUBLICATIONS

Bishop et al., "High Sensitivity, High-Speed FET Sense Latch," *IBM Tech. Discl. Bull.;* vol. 18, No. 4, pp. 1021-1022; 9/1975.

Barsuhn et al., "Semiconductor Storage Circuit Utilizing Two Device Memory Cells," *IBM Tech. Discl. Bull.;* vol. 18, No. 3, pp. 786-787; 8/1975.

Stein et al., *IEEE Journal of Solid–State Circuits,* vol. SC-7, No. 5, pp. 336-340; 10/1972.

*Primary Examiner*—Larry N. Anagnos
*Attorney, Agent, or Firm*—Hill, Gross, Simpson, Van Santen, Steadman, Chiara & Simpson

[57] ABSTRACT

A function generator is connected to a node formed by the source electrodes of the switching transistors of flip-flops in which the flip-flops are each composed of two circuit arms. Each of the circuit arms has a load transistor and a switching transistor, constructed as MOS transistors, for the amplification of read-out signals supplied by a MOS memory. Each flip-flop is connected at the connection points of the load transistors and switching transistors to a sub-portion of a bit line of the MOS memory. The curve of the voltage supplied to the node is such that, at the beginning of a cycle of the read-out process, the node is charged, and for the evaluation of the read-out signals on the bit lines the node is discharged in a controlled manner such that the flip-flops trigger into a state governed by the read-out signal on the bit lines. A pre-discharge circuit operates between the charging and discharging of the node to pre-discharge the node so that the switching transistors of the flip-flops connected to the node are rendered conductive, and the subportions of the bit lines are set at the voltage which prevails across the node, and which has been modified by the threshold voltage of the switching transistors of the flip-flops.

5 Claims, 5 Drawing Figures

FUNCTION GENERATOR FOR THE PRODUCTION OF A VOLTAGE ACROSS A NODE TO WHICH ARE CONNECTED FLIP-FLOPS WHICH ARE ARRANGED IN BIT LINES OF A MOS MEMORY AND CONSISTS OF MOS TRANSISTORS

BACKGROUND OF THE INVENTION

1. Field of the Invention

The present invention relates to a function generator for the production of a voltage across a node which is formed by the source electrodes of the switching transistors of flip-flops, wherein each flip-flop comprises two circuit arms each having a load transistor and a switching transistor, and wherein the load and switching transistors are constructed as MOS transistors for the amplification of read-out signals supplied by a MOS memory, wherein each flip-flop is connected at the connection points of the load and switching transistors to a respective sub-portion of a bit line of the MOS memory, and more particularly wherein the curve of the voltage supplied to the node is such that, at the beginning of a read-out cycle, the node is charged, and for the evaluation of the read-out signals on the bit line is discharged in a controlled manner such that the flip-flops trigger into a state governed by a read-out signal on the bit lines.

2. Description of the Prior Art

In order to evaluate the read-out signals of dynamic MOS memories, it is known in the art to divide each bit line into two sub-portions, and to arrange a read-out amplifier, designed as a flip-flop, between the two sub-portions. In this connection, one can refer, for example, to the IEEE Journal of Solid State Circuits, Vol. SC7, No. 5, Oct. 1972, Pages 336–340. A read-out amplifier circuit of this type is constructed as a clocked flip-flop. The fundamental properties of this read-out amplifier circuit reside in its symmetry, the low degree of dependence upon parameter fluctuations, and the automatic regeneration of the stored signals. Read-out amplifier circuits of this type are employed, in particular, in MOS memories in which the individual storage cells are single-transistor storage cells.

Further developments of MOS memory technology have been accompanied by a constant increase in the storage density per storage module. This leads to smaller read-out signals, and more greatly fluctuating component parameters. A more suitable amplifier circuit for the evaluation or read-out signals from MOS memories of this type is described, for example, in the IEEE Journal of Solid-State Circuits, Vol. SC8, No. 5, Oct. 1973, Pages 310–318 and the IEEE Journal of Solid State Circuits, Vol. 9, No. 2, April 1974, Pages 49–54. In this read-out amplifier circuit, the load transistors of the flip-flop serve only for pre-charging the sub-portions of the bit lines at the connection points between the load transistor and the switching transistor. During the elevation process of a read-out signal, the load transistors remain blocked. If, following the read-out of an item of information from a storage cell, a signal voltage has set up on the sub-portions of a bit line, at the connection point between the source electrodes of the switching transistors the voltage is then slowly reduced. This ensures that only one of the switching transistors is rendered conductive, namely the transistor whose drain electrode is connected to the read-out signal. With this mode of operation, the amplification of the flip-flop is very considerable, and fluctuations in the geometry of the transistors and the capacitances of the bit line have virtually no influence.

A disadvantage of this read-out amplifier circuit resides in its relatively long evaluation time. Therefore, attempts have been made to reduce the voltage at the connection point of the source electrodes of the switching transistors in accordance with an optimum curve. The curve is calculated to be such that one of the switching transistors is at the blocking limit, or alternatively operates in a weakly conductive state in which the current is constant. This measure serves for reducing the resultant evaluation time. However, the evaluation time is still relatively long. This is true, in particular, when for reasons of space economy a plurality of read-out amplifier circuits of a storage module are commonly connected to a circuit arrangement which serves to set up the voltage at the connection point of the source electrodes of the switching transistors, hereinafter referred to as the node. The relatively great threshold voltage fluctuations of the switching transistors of the non-adjacent flip-flops then necessitate a substantial increase in the evaluation time of the read-out signals.

SUMMARY OF THE INVENTION

The primary object of the invention is to provide a function generator for the production of the voltage across the node to which a plurality of flip-flops is connected for the evaluation of read-out signals, which function generator operates in such a manner that the plurality of flip-flops connected to the node do not influence the evaluation time of the read-out signals.

The above object is realized in a circuit of the type described above in that a preliminary discharge circuit is provided, which during the interval of time between the charging and discharging of the node pre-discharges the node, so that the switching transistors of the flip-flops which have their source electrodes connected to the node are rendered conductive, and the sub-portions of the bit lines are set at the voltage which is connected to the node and which has been modified by the threshold voltage of the switching transistors of the flip-flops.

Therefore, this pre-discharging of the node ensures that the sub-portions of the bit lines are set at a voltage which already takes into consideration the threshold voltage of the switching transistors of the flip-flops. Any change in the voltage across the node during the evaluation process therefore influences all of the flip-flops in the same manner, and differing threshold voltages of the switching transistors of the flip-flops no longer exert any influence.

The preliminary discharge circuit can comprise two transistors which are connected in parallel and which are operated by timing signals. The two transistors can be dimensioned in such a manner, and the timing signals can be timed in such a way that the discharge of the node across the two transistors takes place only to such an extent that, in spite of differing threshold voltages of the switching transistors, all of the sub-portions of the bit lines can be set individually to the change in the node voltage which is governed by the threshold voltages.

BRIEF DESCRIPTION OF THE DRAWINGS

Other objects, features and advantages of the invention will be best understood from the following detailed description, taken in conjunction with the accompanying drawings, on which.

DESCRIPTION OF THE PREFERRED EMBODIMENTS

Figure 1:
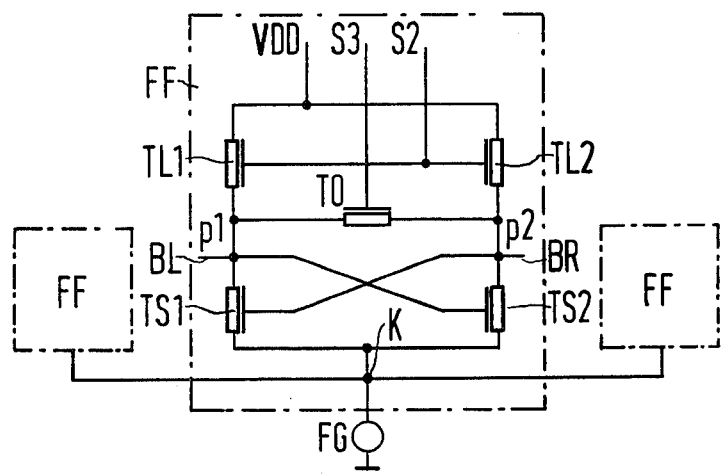
FIG. 1 is a schematic circuit diagram which illustrates read-out amplifier circuits, constructed as flip-flops, and a function generator which may be constructed in accordance with the principles of the present invention.

Referring to FIG. 1, a read-out amplifier circuit is illustrated as comprising a flip-flop FF and a function generator FG, which contains a pre-discharge circuit.

The flip-flop FF in each case comprises two arms each including a load transistor TL and a switching transistor TS. The one arm therefore contains a load transistor TL1 and a switching transistor TS1, whereas the other arm contains a load transistor TL2 and a switching transistor TS2. The connection point between a switching transistor TS and a load transistor TL is connected to a respective sub-portion of a bit line B. Accordingly, the sub-portion BL of the bit line B is connected to the connection point p1 between the load transistor TL1 and the switching transistor TS1, whereas the sub-portion BR of the bit line B is connected to the connection point p2 between the load transistor TL2 and the switching transistor TS2. Furthermore, the connection points p1 and p2 are connected together by way of a transistor TO, referred to as a balancing transistor. The connection point between the source electrodes of the switching transistors TS1 and TS2 is referred to as a node, here referenced K. The load transistors TL1 and TL2 are operated with the aid of a timing signal S2, whereas the balancing transistor TO is operated with the aid of a timing signal S3. A fixed voltage VDD is also connected to the load transistors TL1 and TL2.

The node K is connected not only to a flip-flop FF, but also to a plurality of flip-flops which are all constructed in the same manner as the flip-flop FF in FIG. 1. However, these flip-flops differ in respect of the properties which the switching transistors TS possess. Thus, it is not possible to construct the switching transistors TS of the flip-flops in such a way that all have the same threshold voltage. The function generator FG, which is connected to the node K, is therefore constructed in such a manner that the voltage which it feeds to the node K influences the flip-flops FF in such a manner that the differing threshold voltages of the switching transistors TS of the various flip-flops do not influence the evaluation process.

Figure 4:
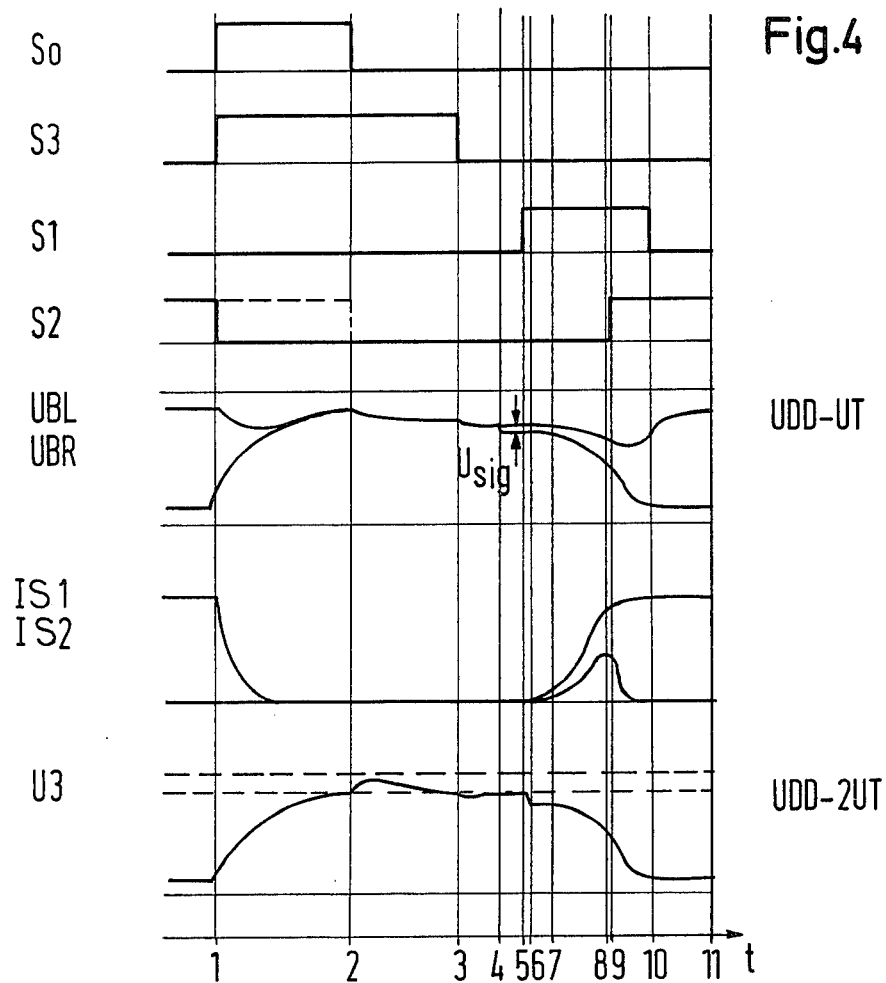
FIG. 4 is a signal diagram which illustrates the mode of operation of the read-out amplifier circuit of FIG. 1.

Referring to FIG. 4 it will now be explained how it is possible to avoid the influence of the differing threshold voltages of the switching transistors. Here, it has been assumed that the transistors are n-channel transistors. Accordingly, the voltages provided in FIG. 4 are positive voltages.

Before it is possible to analyze a read-out signal connected to the bit line portions BL and BR, the read-out amplifier circuit must be pre-charged. For this purpose, the balancing transistor TO is rendered conductive, and is fed with a signal S3. The load transistors TL1 and TL2 can also be brought into the conductive state by the connection of a timing signal S2. The node K is then connected to the voltage U3, which in this case is still low. Under these conditions, the bit line portions BL and BR are charged to the voltage UDD−UT, where UT is the threshold voltage of the load transistors TL1 and TL2. It is also possible to charge the bit line portions BL and BR by way of transistors which have not been illustrated, for example in that a signal SO (FIG. 4, first line) is connected to these transistors. It is also possible to charge the bit line portions BR and BL to another voltage, for example to the voltage UDD−2 UT. Since the bit line portions BR and BL can be charged either by way of separate transistors and/or by way of the load transistors TL, in FIG. 4 the signal S2 which occurs during the precharging process of the bit line portions is shown only in broken lines. In this phase of operation, the switching transistors TS1 and TS2 are likewise in the conductive state. The node K is also charged, and in fact to approximately the voltage $U3 = UDD - UT - (UT + \Delta UT_{max})$, where $\Delta UT_{max}$ is the maximum occurring threshold voltage difference of all the switching transistors TS which are connected to the node K. The duration of the pre-charging phase extends from the time $t1$ to $t2$. During this time, the node K is charged.

At the end of the pre-charging step, thus at the time $t2$, the pre-charging signal SO and the signal S2 are disconnected, which means that the load transistors TL1 and TL2 assume the blocking state.

The pre-charging is followed by the read-out preparation interval, which is composed of the time zones $t2$ to $t3$ and $t3$ to $t4$.

During the time zone $t2$ and $t3$ the timing signal S3 is still connected to the balancing transistor TO. Therefore, the balancing transistor TO is still in the conductive state and the bit line portions BL and Br are still connected to one another. Now, the voltage across the node K is reduced, in accordance with the curve U3 in FIG. 4, by means of the function generator FG, and with the aid of a pre-discharge circuit which is a part of the function generator FG. As the switching transistors TS1 and TS2 are still in the conductive state, the voltage across the node K passes by way of the switching transistors to the bit line portions BL and BR. On these bit line portions BL and BR a voltage is now set up which is equal to the voltage U3 across the node plus the voltage $UT_{min}$, where $UT_{min}$ is the lower threshold voltage of the switching transistors TS1 and TS2. Therefore, voltages which are dependent upon the threshold voltage of the switching transistors TS are formed on the bit line portions BR and BL. When a plurality of flip-flops comprising switching transistors of differing threshold voltages are connected to the node, in accordance with the different threshold voltages of the switching transistors, different voltages will be set up on the bit line portions BR and BL of different bit lines. The greater the threshold voltage of the switching transistor, the more positive becomes the voltage across the corresponding bit line portions of a bit line. This ensures that any change in the voltage across the node K uniformly influences all of the flip-flops connected to that node. This means that the time of the triggering of the flip-flops is the same for all of the flip-flops, and is no longer dependent upon the different threshold voltages of the individual switching transistors. The pre-discharge circuit modifies the voltage across the node K by a quantity which is dependent upon the threshold voltages of the switching transistors, and which will expediently amount to approximately 1 volt.

During the time zone from $t3$ to $t4$ the timing signal S3 is disconnected and the balancing transistor TO is blocked. As a result, the bit line portions BR and BL are cut off. The reduction in the time signal S3 also results in the voltage of the bit line portions BR and BL being reduced by the parasitic capacitances of the balancing transistor TO. Consequently, the switching transistors TS are safely blocked after the time $t4$.

After the time $t4$, the read-out process from a storage cell begins. Now, that is during the time zone $t4$ to $t5$, an item of information is read from a storage zone and, accordingly, a voltage difference, the read-out signal $U_{sig}$, is set up on the two bit line portions BR and BL. In FIG. 4, this is indicated by two arrows in the time zone $t4$ to $t5$, at the voltages UBL and UBR which apply to the bit line portions BL and BR, respectively. It will be seen that a voltage difference is set up on the bit line portions BR and BL. The switching transistors TS1 and TS2 of the flip-flop continue to be blocked.

At the time $t5$, the evaluation process begins. For this purpose, with the signal S1, that part of the function generator which again discharges the node K is connected. The discharging is carried out in accordance with the curve which defines the voltage U3 in FIG. 4. Thus, initially the voltage across the node K is reduced very rapidly. The rapid reduction of the voltage U3 across the node K now renders conductive that switching transistor in the flip-flop FF whose drain electrode is connected to the voltage change produced by the read-out of the item of information. If it is assumed that a storage cell which is connected to the bit line portion BL is read out, the switching transistor TS1 is rendered conductive. Therefore, a current can flow through the switching transistor TS1, the corresponding currents IS1 through the transistor TS1 and IS2 through the transistor TS2 also being illustrated in FIG. 4.

During the time $t6$ to $t7$, the voltage U3 across the node K is reduced very slowly, and remains virtually constant. This process speeds up only gradually, and in the exemplary embodiment takes place in such a manner that the previously blocked switching transistor is also rendered conductive again. In the example set forth above, this is the switching transistor TS2 and this action can be seen from the curves of the voltages UBL and UBR and from the curves of the currents IS1 and IS2 in FIG. 4. However, the curve of the reduction in the voltage U3 across the node K is now controlled so that, in spite of differences in the geometry of the switching transistors and the capacitances of the bit line portions, thus under unfavorable conditions, the flip-flop nevertheless reaches its trigger point again, and therefore in the example given above the switching transistor TS2 is blocked again. This state occurs at the time $t8$. Accordingly, the current through the switching transistor TS2 decreases again, whereas the voltage difference on the bit line portion increases rapidly.

At the time $t9$, the timing signal S2 is connected to the load transistors TL1 and TL2. The load transistors TL1 and TL2 are thus rendered conductive. The result of this operation is that the bit line portions BR and BL are set to the "0" and "1" levels, respectively. On the other hand, the discharge of the node K is further accelerated. The node K is discharged until the time $t10$. On the bit line portion, for example the bit line portion BR, on which the voltage change occurred due to the information read from the storage cell, a level has set up which can be employed to regenerate the information for the read-out storage cell.

At the time $t10$, the timing signal S1 is disconnected and therefore the function generator FG is cut off from the flip-flop FF. At the time $t11$, the read-out and regenerating processes are terminated.

The function of the read-out amplifier circuit has been described on the basis of a discharge curve which is extremely advantageous. Naturally, the discharge of the node K can also take place in a different manner, e.g. in the manner described in the above-referenced publications. The discharge of the node K does not, in fact, affect the preliminary discharge of the node K in the time zone $t2$ to $t3$. Furthermore, the operation of the read-out amplifier circuit has been described with reference to a flip-flop. It has already been stated that the node K can be connected to a plurality of flip-flops FF, which can all be constructed in accordance with the flip-flop FF of FIG. 1. These other flip-flops are operated in precisely the manner set forth above with reference to the flip-flop FF of FIG. 1.

Figure 2:
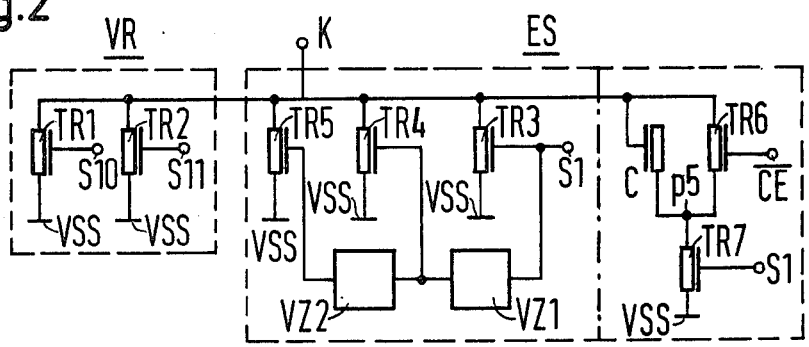
FIG. 2 is a schematic circuit diagram of a function generator having a pre-discharge circuit and which may be utilized in practicing the present invention.

Referring to FIG. 2, an embodiment of the function generator FG is illustrated. In FIG. 2, the function generator FG comprises a pre-discharge circuit VR, which is active from the time zone $t2$ to $t3$, and a discharge circuit ES, which is active from the time zone $t5$ to $t10$. The discharge circuit ES is here illustrated in the form of a circuit arrangement which has already been described in detail in my copending application Ser. No. 798,431, filed May 19, 1977. Therefore, the discharge circuit ES will be discussed only briefly below.

The exemplary embodiment of the pre-discharge circuit VR illustrated in FIG. 2 comprises two transistors TR1 and TR2. These transistors are connected in parallel with one another, and their controlled paths are connected between the node K and a fixed potential VSS. The control input of the transistor TR1 is connected with a first timing signal S10 and the control input of the transistor TR2 is connected with a timing signal S11. These timing signals S10 and S11 occur in the time zone $t2$ to $t3$. The transistor TR2 is very briefly rendered conductive by the timing signal S11, in order to speed up the discharge process at the beginning of the preliminary discharge. The timing signal S10, which is connected simultaneously with the timing signal S11, has a longer duration and brings about a further discharge of the node K. As, however, the transistors TR1 and TR2 are constructed and dimensioned differently, the influence exerted by these transistors on the discharge of the node K is different. Here, the transistor TR1 is smaller than the transistor TR2. This means that the ratio W/L (channel width to channel length) is selected to be 200 for the transistor TR2 and 40 for the transistor TR1, for example. It is therefore readily apparent that through the selection of the ratio W/L of the transistors TR1 and TR2, and by the time duration of the timing signals S10 and S11, it is possible to influence the degree of the pre-discharge of the node K in the desired manner. The timing signal S11 can be connected, for example, for 20–30 ns, and the timing signal S10 can be connected for 40–50 ns, for example.

The discharge circuit ES comprises a circuit arrangement by which the node K is discharged very rapidly in the time zone $t5$ to $t6$, and a circuit arrangement which undertakes the remainder of the discharge of the node K. The rapid discharge is carried out with the aid of a pair of transistors TR6 and TR7 and a capacitor C. The control input of the transistor TR6 is connected with a signal $\overline{CE}$, i.e., a signal is applied when the module is not selected, and thus a module is not fed with the module selector signal CE. For such time as the signal $\overline{CE}$ is applied, the transistor TR6 is conductive, and the connection point $p5$ can charge to the voltage of the node K. At the beginning of the evaluation process, the timing signal S1 renders the transistor TR7 conductive, whereas the transistor TR6 is blocked. As a result, the capacitance C can discharge very rapidly, and the voltage across the node K changes correspondingly very rapidly.

The further discharge of the node K is carried out with the aid of the plurality of transistors TR3, TR4 and TR5 and a pair of delay circuits VZ1 and VZ2. The timing signal S1 is directly fed to the transistor TR3 and brings the transistor TR3 into the conductive state. As a result, the node K can discharge by way of the transistor TR3. At the end of the delay period, determined by the delay circuit VZ1, the transistor TR4 is also rendered conductive as a result of the application of the delayed signal S1. This causes an acceleration of the discharge process of the node K. At the end of a further delay interval, produced by the delay circuit VZ2, the transistor TR5 is also finally rendered conductive. As all three transistors TR3, TR4 and TR5 are conductive, the node K is discharged very rapidly in the zone $t9$ to $t10$. The shape of the discharge curve can be determined by the dimensioning of the transistors TR3, TR4 and TR5, such as the W/L technique disclosed above, and the delay times of the delay circuits VZ1 and VZ2.

Figure 3:
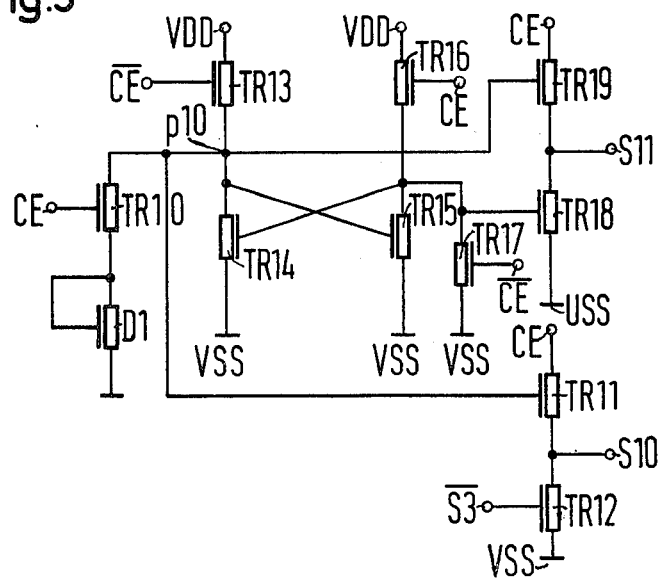
FIG. 3 is a schematic circuit diagram of an arrangement for producing timing signals for the pre-discharge circuit illustrated in FIG. 2.

Referring now to FIG. 3, a circuit arrangement is illustrated with the aid of which the timing signals S10 and S11 are produced. This circuit arrangement comprises a field effect transistor connected as a diode D1, and a plurality of transistors TR10–TR19. The timing signals S11 and S10 are triggered by the module selector signal CE. Here, the circuit arrangement operates such that the timing signals S10 and S11 initially follow the module selector signal CE, whereupon, however, they assume a lower amplitude than that of the module selector signal CE. For such time as the module selector signal is not applied, whereas its inverse $\overline{CE}$ is applied, the transistor TR13 is conductive and the connection point $p10$ can be charged. The result is that the transistors TR11 and TR15 are rendered conductive. On the other hand, the transistors TR18 and TR12 are blocked. Since, however, the module selector signal CE is not yet connected to the transistors TR19 and TR11, and therefore the potential across these points is zero, the potential of the signals S10 and S11 is also zero. If the module selector signal CE is now applied, initially the timing signals S11 and S10 directly follow the module selector signal CE. However, as the transistor TR10 is simultaneously rendered conductive by the module selector signal CE, the connection points $p10$ discharges. The result is that after a certain length of time the transistor TR15 becomes blocked, whereas the transistor TR14 is rendered conductive, particularly since the transistor TR16 is brought into the conductive state. Therefore, the transistor TR18 becomes conductive, whereas the transistor TR19 is blocked. The timing signal S11 therefore returns to its initial value again. The transistor TR11 remains conductive, on the other hand, although it limits the amplitude of the timing signal S10. Not until the signal $\overline{S3}$ is connected to the transistor TR12, thus at the time $t3$, is the transistor opened and the signal S10 returns to its initial state.

Figure 5:
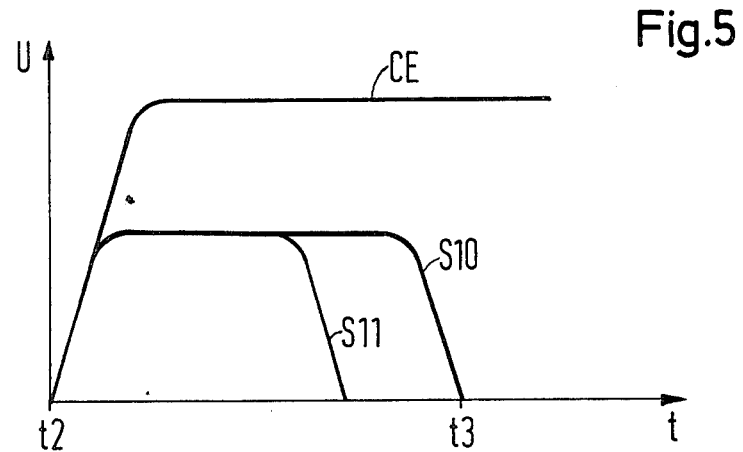
FIG. 5 is a signal diagram which graphically illustrates the timing signal supplied to the pre-discharge circuit.

FIG. 5 illustrates the relationships between the module selector signal CE and the timing signal S10 and S11. It can be seen in FIG. 5 that the timing signals S10 and S11 initially directly follow the module selector signal CE, but after a length of time, governed by the dimensioning of the circuit arrangement, no longer maintain the rise of the module selector signal CE. It can also be seen in FIG. 5 that the timing signal S11 terminates earlier than the timing signal S10, due to the aforementioned blocking of the transistor TR19 prior to the application of the signal $\overline{S3}$ to the transistor TR12.

The primary advantage of a function generator constructed in accordance with the present invention resides in the fact that by employing the pre-discharge circuit the node K is pre-discharged, prior to the actual discharge process, during the time of the evaluation of a read-out signal, and in this manner the influence of the various threshold voltages of the switching transistors of the flip-flops upon the evaluation time is eliminated.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a memory reading system of the type wherein, for each read-out circuit, the source electrodes of metal-oxide-semiconductor switching transistors of a flip-flop are connected together at a node which is common for all read-out circuits, the switching transistors are in separate arms of the flip-flops and have respective metal-oxide-semiconductor load transistors connected in series therewith, and the connection points of the load transistors and switching transistors are connected to respective bit line portions of a divided bit line, and wherein the switching transistors connected to the node are operable to pre-charge the node prior to a signal evaluation portion of a reading process and a function generator is connected to the node to controllably discharge the node during the signal evaluation portion of the reading process during which the load transistors are blocked so that each flip-flop connected to the node is triggered to a state governed by the read-out signal on the respective bit lines, the improvement in combination therewith, wherein:

said function generator comprises a pre-discharge circuit including inputs for receiving control signals and transistor means connected to said inputs and to the node for pre-discharging the node in response to said control signals, so that the switching transistors of the flip-flops are rendered conductive to place respective voltages on the bit line portions which are equal to the node voltage modified by the individual threshold voltages of the switching transistors.

2. The improved memory reading system of claim 1, wherein said transistor means comprises first and second transistors connected in parallel across the node, each of said transistors including a respective control electrode for receiving first and second timing signals, respectively, as said control signals, said transistors being field effect transistors and the pre-discharging being influenced by the length of said timing signals and by the W/L ratio of said transistors, where W is the channel width and L is the channel length of a field effect transistor.

3. In a memory reading system of the type wherein, for each read-out circuit, the source electrodes of metal-oxide-semiconductor switching transistors of a flip-flop are connected together at a node which is common for all read-out circuits, the switching transistors are in separate arms of the flip-flops and have respective metal-oxide-semiconductor load transistors connected in series therewith, and the connection points of the load transistors and switching transistors are connected to respective bit line portions of a divided bit line, and wherein the switching transistors connected to the node are operable to pre-charge the node prior to a signal evaluation portion of a reading process and a function generator is connected to the node to controllably discharge the node during the signal evaluation portion of the reading process while the load transistors are blocked so that each flip-flop connected to the node is triggered to a state governed by the read-out signal on the respective bit lines, the improvement in combination therewith, wherein:

said function generator comprises a pre-discharge circuit including inputs for receiving control voltages and transistor means connected to said inputs and to the node for pre-discharging the node in response to said control signals, so that the switching transistors of the flip-flops are rendered conductive to place respective voltages on the bit line portions which are equal to the node voltage modified by the individual threshold voltages of the switching transistors; wherein said transistor means comprises first and second transistors connected in parallel across the node, each of said transistors including a respective control electrode for receiving first and second timing signals, respectively, as control signals, said transistors being field effect transistors and the pre-discharging being influenced by the length of said timing signals and by the W/L ratio of said transistors, where W is the channel width and L is the channel length of a channel of a field effect transistor; and comprising means for generating said first and second timing signals including an input for receiving a module selector signal and means responsive to said module selector signal to produce said first and second timing signals with amplitudes less than the amplitude of the module selector signal and leading edges corresponding to the leading edge of the module selector signal.

4. The improved memory reading system of claim 3, wherein said first and second transistors are constructed such that the W/L ratio of said second transistor is greater than that of said first transistor, and said means for generating said timing signals includes means for generating said second timing signal to have a shorter duration than that of said first timing signal.

5. The improved memory reading system of claim 3, wherein said means for generating said timing signals comprises a trigger circuit including a first arm having a switching transistor and a load transistor which is driven by a signal which is the complement of said module selector signal, and a second arm having a feedback connection to said first arm and including a switching transistor and a load transistor and which is driven by the module selector signal, a first series circuit connected to the junction of said switching transistor and said load transistor of said first arm and including a transistor driven by the module selector signal and a diode, a second series circuit including a first transistor having a control electrode connected to said junction and an electrode of its controlled path for receiving said module selector signal and a second transistor having a control electrode for receiving and being driven by a third timing signal, a third series circuit comprising a first transistor having a control electrode connected to said junction and an electrode of its controlled path connected to receive said module selector signal, and a second transistor having a control input connected to the junction of the load transistor and switching transistor of the other arm of the trigger circuit, an output for said first timing signal connected to the junction of said transistors of said second series circuit and an output for said second timing signal connected to the junction of said transistors of said third series circuit.

* * * * *